United States Patent
Hamoudi et al.

(10) Patent No.: US 12,274,156 B2
(45) Date of Patent: Apr. 8, 2025

(54) MOLECULAR BUILDING BLOCK METHODS FOR PRODUCING HIGH-EFFICIENCY ORGANIC SOLAR CELLS AND DEVICES AND SYSTEMS PRODUCED THEREFROM

(71) Applicant: Qatar Foundation for Education, Science and Community Development, Doha (QA)

(72) Inventors: Hicham Hamoudi, Doha (QA); Golibjon Berdiyorov, Doha (QA)

(73) Assignee: HAMAD BIN KHALIFA UNIVERSITY, Doha (QA)

( * ) Notice: Subject to any disclaimer, the term of this patent is extended or adjusted under 35 U.S.C. 154(b) by 0 days.

(21) Appl. No.: 18/425,736

(22) Filed: Jan. 29, 2024

(65) Prior Publication Data
US 2024/0292636 A1    Aug. 29, 2024

Related U.S. Application Data

(62) Division of application No. 16/922,508, filed on Jul. 7, 2020, now Pat. No. 11,974,443.

(60) Provisional application No. 62/872,073, filed on Jul. 9, 2019.

(51) Int. Cl.
| | |
|---|---|
| *H01L 31/00* | (2006.01) |
| *H10K 30/35* | (2023.01) |
| *H10K 71/15* | (2023.01) |
| *H10K 71/40* | (2023.01) |
| *H10K 71/50* | (2023.01) |

(Continued)

(52) U.S. Cl.
CPC ........... *H10K 71/15* (2023.02); *H10K 30/352* (2023.02); *H10K 71/40* (2023.02); *H10K 71/50* (2023.02); *H10K 30/50* (2023.02); *H10K 71/00* (2023.02)

(58) Field of Classification Search
CPC ...................................................... H01L 31/18
See application file for complete search history.

(56) References Cited

U.S. PATENT DOCUMENTS

| | | |
|---|---|---|
| 2014/0261645 A1 | 9/2014 | Hoertz |
| 2019/0326064 A1 | 10/2019 | Maarouf et al. |
| 2020/0152395 A1 | 5/2020 | Lutsen et al. |

FOREIGN PATENT DOCUMENTS

JP        2014225485 A        12/2014

OTHER PUBLICATIONS

Hicham Hamoudi; "Bottom-up nanoarchitectonics of two-dimensional freestanding metal doped carbon nanosheet"; Journal—RSC Advances; Issue 42; 2014; (2 pages).

(Continued)

*Primary Examiner* — Austin Murata
(74) *Attorney, Agent, or Firm* — K&L Gates LLP

(57) ABSTRACT

Disclosed is a fabrication method for constructing low-cost, morphologically stable, highly ordered, and crystalized layered organic solar cells. The method implements self-assembled molecular monolayers as building blocks (a bottom up strategy) to fabricate a device. This approach enables the creation of a layered material with desired morphology in a controlled way. In such geometry, optoelectronic and transport properties can be controlled by metal atom inclusions into the molecular monolayers, which presents a range of options in creating photo-sensitive molecular building blocks to cover a wide range of the solar spectra from IR to visible to UV.

18 Claims, 5 Drawing Sheets
(4 of 5 Drawing Sheet(s) Filed in Color)

(51) Int. Cl.
      *H10K 30/50*      (2023.01)
      *H10K 71/00*      (2023.01)

(56)              References Cited

OTHER PUBLICATIONS

J.E. Ten Elshof; "4—Chemical solution deposition techniques forepitaxial growth of complex oxides"; Woodhead Publishing Series in Electronic and Optical Materials; 2015; (2 pages).
Hicham Hamoudi; "On the self assembly of short chain alkanedithiols"; Physical Chemistry Chemical Physics; Issue 45; 2008; (2 pages).
Hiroko Yamada, et al; "Photovoltaic Properties of Self-Assembled Monolayers of Porphyrins and Porphyrin-Fullerene Dyads on ITO and Gold Surfaces"; Journal of the Americal Chemical Society; 2003; (2 pages).
Rotem Har-Lavan, et al.; "Toward metal-organic insulator-semiconductor solar cells, based on molecular monolayer self-assembly on n-Si"; Jan. 28, 2009; AIP; (2 pages).
Qiao, et al.; "Self-assembly monolayers boosting organic-inorganic halide perovskite solar cell performance"; Journal of Materials Research; Feb. 1, 2018; vol. 33.

MOLECULAR BUILDING BLOCK METHODS FOR PRODUCING HIGH-EFFICIENCY ORGANIC SOLAR CELLS AND DEVICES AND SYSTEMS PRODUCED THEREFROM

CROSS REFERENCE TO RELATED APPLICATIONS

The present application is a Divisional Application based on U.S. application Ser. No. 16/922,508, filed on Jul. 7, 2020, which claims priority to U.S. Ser. No. 62/872,073, filed Jul. 9, 2019, the entire contents of which are being incorporated herein by reference.

BACKGROUND

Solution-processed bulk heterojunction organic solar cells have received a lot of attention due to their potential for applications as a renewable, non-conservative (green) and clean source of energy. Such an interest towards these organic photovoltaics (OPV) is due to their low-cost manufacturing, light weight, mechanical flexibility, fusibility, as well as tunability of the structural and opto-electronic properties. One of the most efficient OPV materials to date consists of an electron-donating polymer [P3HT] and an electron-accepting fullerene [PCBM]. Increased effort has been made in recent years to optimize the regioregular P3HT/PCBM device performance by controlling material properties, such as molecular weight of polymer compounds, and fabrication conditions, such as thermal annealing.

The main issue faced by the OPVs is the poor morphological stability, which requires additional research in developing OPVs with enhanced operational stability. This is in part due to the conventional fabrication methods, such as spin-coating or convective coating, used in creating such heterojunctions. These conventional methods result in non-uniform film and disordered morphology, which in turn affect structural features and optoelectronic properties of the material. In addition, these conventional coating methods have poor scalability for large-scale production.

SUMMARY

The present disclosure relates to the development of low-cost, morphologically stable, organic heterojunction materials for transparent solar cells and optoelectronic applications.

The present disclosure describes a new building blocks (bottom up) method of fabricating stable organic solar cells. The method uses mixed molecular building blocks for the synthesis of stacked self-assembled molecular monolayers (SAMs), where the electronic and optical properties of each layer can be well controlled by incorporating suitable metal atoms into the monolayer. Using this method, the inventors are able to create highly-ordered organic photovoltaics which present a great potential for building integrated applications. Further, the inventors use an all-solution-based device engineering method, which would radically decrease the fabrication cost for the disclosed method and products to be competitive in the OPV market.

Although molecular self-assembly is a well-established strategy in the materials science adopted from the biological systems for creating highly-ordered nanostructures, the present disclosure implements a molecular self-assembly monolayer approach to build new type of materials and devices dedicated to energy conversion and nanoelectronics.

According to one non-limiting aspect of the present disclosure, a method for fabricating an active material for solar cells is provided. The method comprising: providing a substrate; immersing the substrate in a solution comprising molecules capable of self-assembly to form a first stacked self-assembled molecular monolayer on top of the substrate; and depositing a metallic layer on top of the stacked self-assembled molecular monolayer. According to another non-limiting aspect of the present disclosure, the substrate is a gold substrate. According to another non-limiting aspect of the present disclosure, the solution comprising the molecules capable of self-assembly is n-hexane containing dithiol-group molecules. According to another non-limiting aspect of the present disclosure, depositing the metallic layer on top of the first stacked self-assembled molecular monolayer comprises immersing the substrate with the first stacked self-assembled molecular monolayer in a solution with desired metal atom precursors.

According to another non-limiting aspect of the present disclosure, an active material for solar cells includes a substrate; a stacked self-assembled molecular monolayer on top of the substrate; and a metallic layer on top of the stacked self-assembled molecular monolayer.

According to another non-limiting aspect of the present disclosure, a solar cell includes an active material including a substrate; a stacked self-assembled molecular monolayer on top of the substrate; and a metallic layer on top of the stacked self-assembled molecular monolayer.

According to another non-limiting aspect of the present disclosure, the building block method can be used to fabricate a multi junction solar cell to absorb a wide range of the solar spectrum, such as, IR, UV and Visible.

Additional features and advantages are described herein, and will be apparent from the following Detailed Description and the figures.

BRIEF DESCRIPTION OF THE DRAWING

The patent or application file contains at least one drawing executed in color. Copies of this patent or patent application publication with color drawing(s) will be provided by the Office upon request and payment of the necessary fee.

Features and advantages of the present disclosure including disclosed methods and devices produced therefrom and described herein may be better understood by reference to the accompanying drawings in which.

The reader will appreciate the foregoing details, as well as others, upon considering the following detailed description of certain non-limiting embodiments including the disclosed method and devices and systems produced therefrom according to the present disclosure. The reader may also comprehend certain of such additional details upon using the disclosed method and devices and systems described herein.

DETAILED DESCRIPTION

The present disclosure is related to fabricating high-performance, operationally stable organic solar cells using a molecular building-block method. In the proposed architecture, the stability is ensured by cross-linking of the molecules whereas the metal atom inclusion increases the functionality of the devices. This method also extends the applicability of the proposed devices to optoelectronic applications (e.g., light-emitting diodes).

For example, the following are some advantages of the proposed organic photovoltaics over conventional organic and inorganic solar cells:

Low cost, safe and environmentally friendly fabrication methods;
The first SAM can replace expensive and unstable organic hole transport material (e.g. spiro-OMeTAD);
Synthesis of SAMs with well-controlled electronic and optical properties for absorbing different spectrum of the radiation (i.e, tandem cells);
The organic solar cells of the present disclosure are mechanically and operationally more stable, are more durable, and have higher solar conversion efficiency than the conventional organic solar cells; and
The organic solar cells of the present disclosure are cost effective as compared to the conventional organic solar cells based on polymer heterojunctions (P3HT/PCBM).

The disclosed method can create stable organic layered materials with optoelectronic and transport properties suitable for solar energy harvesting and electronics applications implementing a molecular building block strategy.

The synthesis of the layered materials based on molecular building blocks can include the following stages according to an embodiment of the present disclosure.

Stage 1

Figure 1:
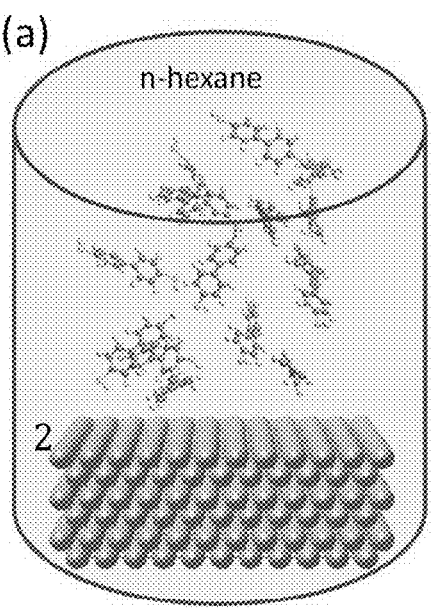
FIGS. 1(a)-1(b) are the schematics of creating SAM of dithiol-group molecules on a gold substrate, according to an aspect of the present disclosure.
Figure 1:
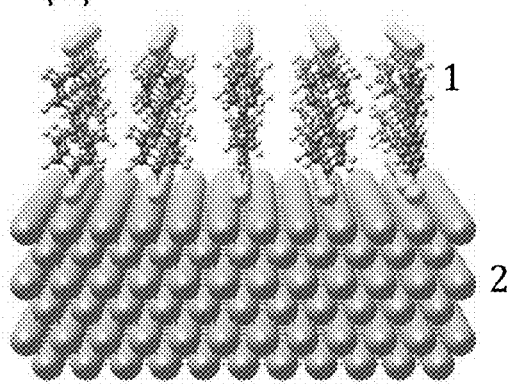

In the first step (see FIG. 1(a)), self-assembly of dithiol-group molecular monolayers 1 can be performed on a metallic (e.g., gold) surface 2, which may play the role of bottom electrode. For example, this step can be performed using the molecular self-assembly processing approach presented in Hamoudi et al. (H. Hamoudi, Z. Guo, M. Prato, C. Dablemont, W. Q. Zheng, B. Bourguignon, M. Canepad and V. A. Esaulov, *On the self assembly of short chain alkanedithiols*, Phys. Chem. Chem. Phys. 10, 6836-6841 (2008)). The gold substrate 2 can be first annealed in a butane/propane flame with intermediate cooling under $N_2$.

Absolute ethanol can be used for the final rinsing before drying under $N_2$. The resulting gold support can be immersed into n-hexane containing the dithiol-group molecules (see FIG. 1(a)). In the absence of ambient light, highly ordered SAMs can be obtained with free standing thiol groups 1, as depicted in FIG. 1(b). The dithiol-end molecules can be chosen in such a way that they represent the hole transport layer (HTM) for creating solar cells. The self-assembled monolayer approach can be used as a tool to create new materials and devices.

Stage 2

Figure 2:
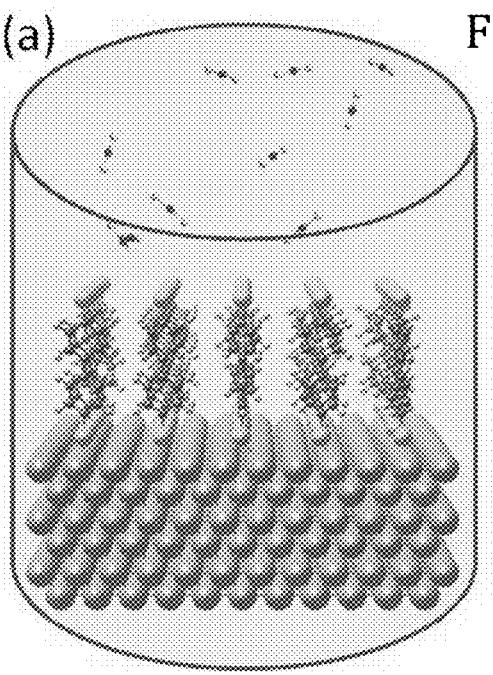
FIGS. 2(a)-2(b) are the schematics of creating a metallic layer on top of SAM of dithiol-group molecules after immersing the sample into the solution with metal atom precursors, according to an aspect of the present disclosure.
Figure 2:
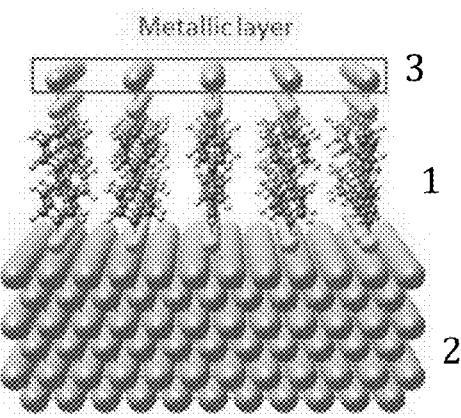
Figure 3:
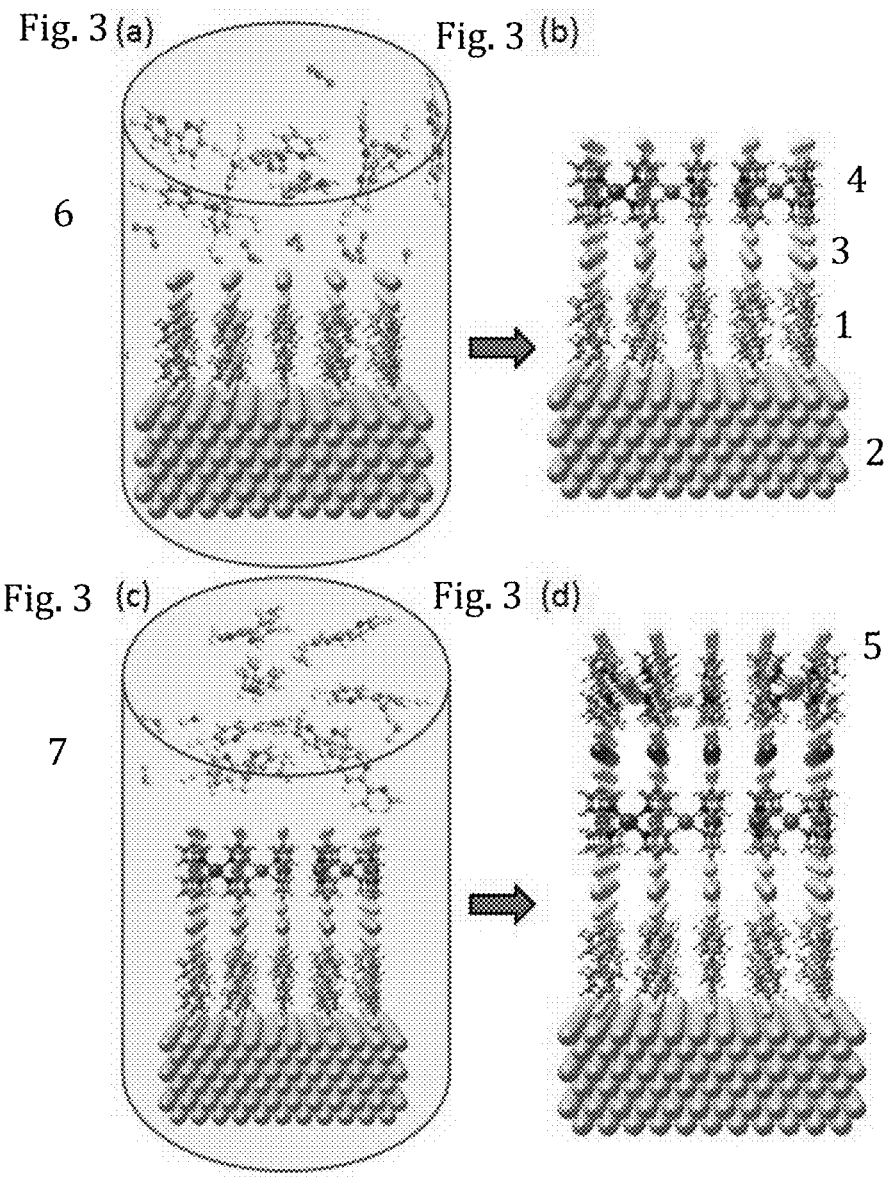
FIGS. 3(a)-3(d) are the schematics of creating SAMs with metal atom inclusions separated by metallic layers, according to an aspect of the present disclosure.

In the second stage, metallic atoms or nanoparticles 3 can be deposited on top of the SAM produced in the previous state. This can be done by immersing the sample into a solution with desired metal atom precursors or nanoparticles, as depicted in FIGS. 2(a)-2(b). This step can create a good contact between the different SAMs. This metallic layer 3 can also serve as a transport channel for the photogenerated charge carriers minimizing their travel distance.

Stage 3

In the next stage, different molecular monolayers (e.g., 4,5) can be self-assembled on top of the first SAM (FIGS. 3(a)-3(d)) to adsorb the different range of the solar spectra (IR, visible, and UV). For example, this step can use the bottom-up fabrication method presented in Hamoudi (H. Hamoudi, *Bottom-up nanoarchitectonics of two-dimensional freestanding metal doped carbon nanosheet*, RSC Adv. 4, 22035 (2014)). First, the suitable molecules for creating SAMs can be chosen. For example, bipyridine dithiol molecules can be a good candidate. Next, the metal substrate with the HTM molecular layer can be immersed in a solution containing active bipyridine dithiol molecules and metal atom precursors 6 (see FIG. 3(a)). This can result in the formation of SAM with metal atom inclusions (FIG. 3(b)), which can determine the optoelectronic properties of the layer. The metal atoms can be chosen in such a way that the resulting layer can absorb a certain frequency or certain frequencies of the spectrum. To broaden the spectrum of the absorbed light, other molecular layers with different metal ions can be created using the same process. For that purpose, the resulting samples can be immersed in solutions 7 again (FIG. 3(c)). A separating metallic layer 3 can be inserted between each SAM as described above (see FIG. 2(b)). Different organometallics and Dye-sensitized molecules can be used in this layer.

The difference between these layers and the first SAM is that the properties of these monolayers, such as electron affinity, ionization potential and localization of electronic states (i.e., HOMO-LUMO states), can be well-controlled by including different redox-active metal atoms, which are trapped between the pyridine rings of the SAMs. This approach can enable the shifting of the active-layer absorption spectrum to the infrared region for the development of the transparent solar cell technology.

Figure 5:
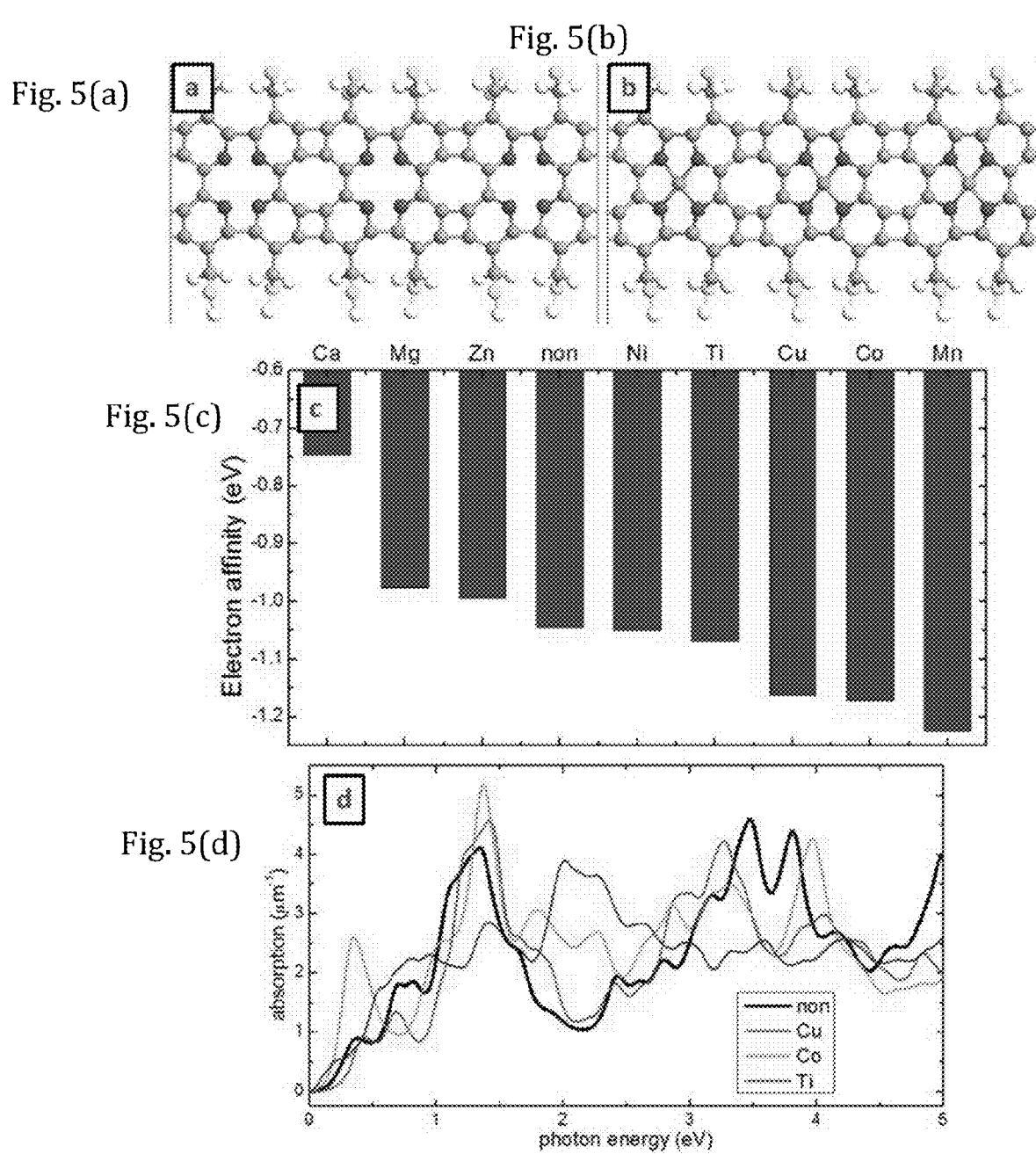
FIGS. 5(a)-(d) show the density-functional theory results: (a, b) optimized structures of cross-linked 5,5'-bis(mercaptomethyl)-2,2'-bipyridine (BPD) molecules without (a) and with (b) metal atom inclusions; (c) electron affinity of the system for different metal ions; and (d) absorption spectra of the BPD self-assembly for different metal ions.

To test the effect of metal atom inclusions on the optoelectronic properties of the proposed SAMs, first principles density functional theory calculations can be conducted. For example, cross-linked 5,5'-bis(mercaptomethyl)-2,2'-bipyridine (BPD) molecules are considered. FIGS. 5(a) and 5(b) show the optimized structure of these molecules without (FIG. 5(a)) and with (FIG. 5(b)) Ni-atom inclusions. FIG. 5(c) shows the electron affinity of the SAM for different metal ions. Electron affinity, which determines the charge carrier transport in the system, is strongly affected by the presence of the metal ions. Optical properties of the considered system are also affected by the metal atoms. This is shown in FIG. 5(d), where the absorption coefficient is plotted as a function of photon energy for different metal ions.

Stage 4

In the next stage, ultraviolet or electron beams can be used to cross-link the molecular layer, thus increasing their stability, for example, as presented in Hamoudi (H. Hamoudi, Bottom-up nanoarchitectonics of two-dimensional freestanding metal doped carbon nanosheet, RSC Adv. 4, 22035 (2014)).

Stage 5

Figure 4:
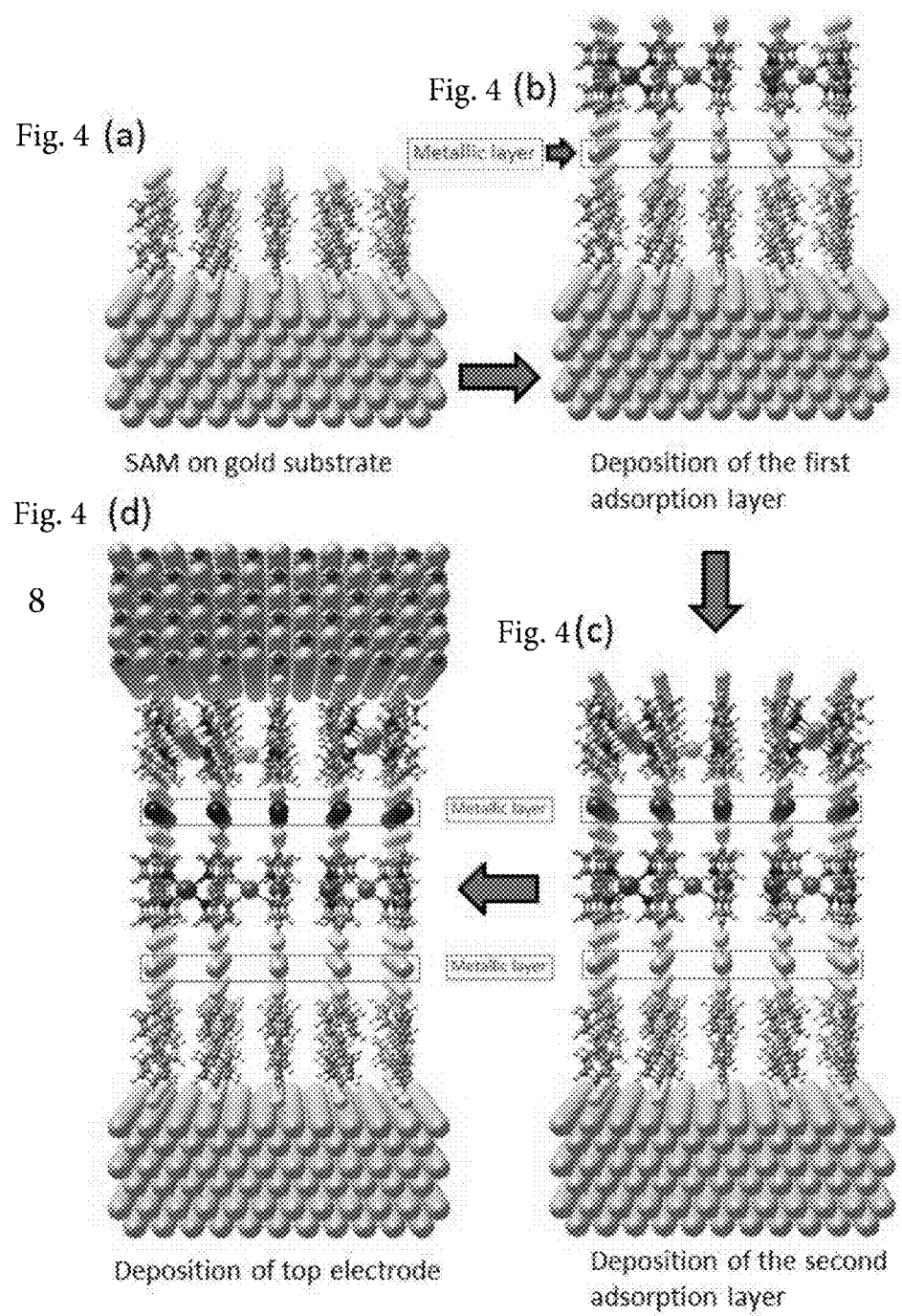
FIGS. 4(a)-4(d) are the schematic diagram of the molecular building-block fabrication process for the layered organic solar absorbers and the deposition of the top electrode, according to an aspect of the present disclosure.

In following stage, a top electrode 8 can be deposited to complete the solar cell (FIG. 4(*d*)). The electrode material can be selected in such way that the transparency of the whole device remains preserved. FIGS. 4(*a*)-4(*d*) summarize the fabrication processes of the device according to an embodiment of the present disclosure.

In the present technology, the solar radiation can be absorbed directly on the SAMs, and the charge collection can also take place through the molecular chains. In some non-limiting examples, the present technology can be composed of metal substrate, highly-ordered self-assembled hole transport material, followed by multilayer of SAMs of light absorbers to utilize solar radiation in a broad range of spectrum from IR to UV. Each SAM can be separated by atomic-thick metallic layers which contribute to a fast collection of photogenerated charge carriers. The molecular SAMs in the building-block devices of the present technology have much more structural stability, especially after electron beam cross-linking of the organic molecules.

Figure 6:
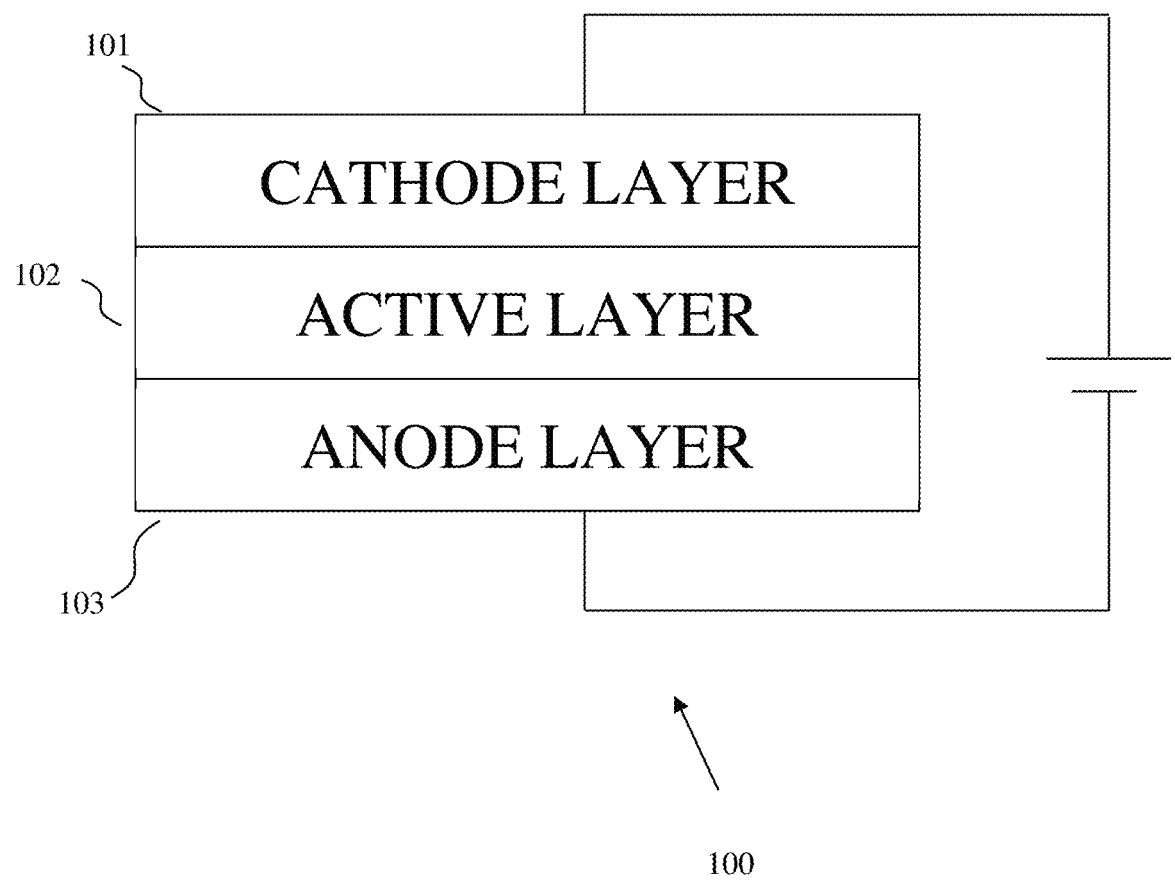
FIG. 6 is a cross section side view illustrating an embodiment of a solar cell device.

FIG. 6 illustrates one implementation of the structure and operating principle of a solar cell device 100 made of the molecular layered materials according to an embodiment of the present disclosure. As shown in FIG. 6, the solar cell device 100 may include a cathode layer 101, an anode layer 103, and an active layer 102 disposed between the cathode layer 101 and the anode layer 103 using the building blocks (bottom up) method. The active layer 102 can include the SAMs according to an embodiment of the present disclosure. The cathode layer 101 functions as a cathode electrode. The anode layer 103 can include an anode electrode.

In some embodiments, the cathode layer 101 can include an Al layer and/or a Ag layer that functions as a cathode, and the anode layer 103 can include an indium-tin oxide (ITO) layer that functions as an anode. In other specific embodiments, the cathode layer 101 can include an indium-tin oxide (ITO) layer that functions as a cathode, and the anode layer 103 can include an aluminum layer that functions as an anode. Other materials may also be used to form the cathode layer 101, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the anode layer 103 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed:

1. An organic active material for a solar cell, the organic active material comprising:
   a metallic substrate which enables self-assembly of organic molecules;
   an organic molecular block on the metallic substrate;
   wherein the organic molecular block includes a metal-molecule multilayered heterostructure formed by metal-ion mediated self-assembly of organic molecules;
   wherein the metal-molecule multilayered heterostructure includes a plurality of self assembly monolayers connected by metal ions;
   wherein the organic molecular block is formed by immersing the metallic substrate in a first solution to create a molecular self-assembly and then immersing in a second solution to provide metal ions on the molecular self-assembly, where the metal ions serve as mediators for formation of a subsequent molecular self-assembly; and
   wherein the metallic substrate immersed in the first solution and then in the second solution is repeated to form the organic molecular block.

2. The organic active material of claim 1, wherein the metallic substrate has a cleaned surface which enables self-assembly of organic molecules.

3. The organic active material of claim 1, wherein the organic molecular block includes molecular building blocks of organic molecules having a molecular backbone including aromatic or aliphatic and with a thiol group at both ends to allow covalent bonding with metal ions of the metallic substrate.

4. The organic active material of claim 1, wherein an electrode is deposited on the organic molecular block.

5. The organic active material of claim 4, wherein the electrode is a metallic electrode, and wherein the organic molecular block further including a photoactive molecular block.

6. The organic active material of claim 1, wherein the plurality of self assembly monolayers connected by metal ions, of the metal-molecule multilayered heterostructure of the organic active material, act as an absorber of solar radiation in a range of spectrum from IR to UV.

7. The organic active material of claim 1, wherein the metallic substrate includes gold, silver, aluminum or copper.

8. The organic active material of claim 1, wherein the first solution includes n-hexane containing dithiol-group molecules.

9. The organic active material of claim 8, wherein the dithiol-group molecules include bipyridine dithiol molecules.

10. A solar cell comprising:
    an organic active material including a metallic substrate which enables self-assembly of organic molecules and an organic molecular block on the metallic substrate;
    wherein the organic molecular block includes a metal-molecule multilayered heterostructure formed by metal-ion mediated self-assembly of organic molecules;
    wherein the metal-molecule multilayered heterostructure includes a plurality of self assembly monolayers connected by metal ions;
    wherein the organic molecular block is formed by immersing the metallic substrate in a first solution to create a molecular self-assembly and then immersing in a second solution to provide metal ions on the molecular self-assembly, where the metal ions serve as mediators for formation of a subsequent molecular self-assembly; and wherein the metallic substrate immersed in the first solution and then in the second solution is repeated to form the organic molecular block.

11. The solar cell of claim 10, wherein the metallic substrate has a cleaned surface which enables self-assembly of organic molecules.

12. The solar cell of claim 10, wherein the organic molecular block includes molecular building blocks of organic molecules having a molecular backbone including aromatic or aliphatic and with a thiol group at both ends to allow covalent bonding with metal ions of the metallic substrate.

13. The solar cell of claim 10, wherein an electrode is deposited on the organic molecular block.

14. The solar cell of claim 13, wherein the electrode is a metallic electrode, and wherein the organic molecular block further including a photoactive molecular block.

15. The solar cell of claim 10, wherein the plurality of self assembly monolayers connected by metal ions, of the metal-molecule multilayered heterostructure of the organic active material, act as an absorber of solar radiation in a range of spectrum from IR to UV.

16. The solar cell of claim 10, wherein the metallic substrate includes gold, silver, aluminum or copper.

17. The solar cell of claim 10, wherein the first solution includes n-hexane containing dithiol-group molecules.

18. The solar cell of claim 17, wherein the dithiol-group molecules include bipyridine dithiol molecules.

\* \* \* \* \*